(12) United States Patent
Dinger

(10) Patent No.: US 6,600,552 B2
(45) Date of Patent: Jul. 29, 2003

(54) MICROLITHOGRAPHY REDUCTION OBJECTIVE AND PROJECTION EXPOSURE APPARATUS

(75) Inventor: Udo Dinger, Oberkochen (DE)

(73) Assignee: Carl-Zeiss SMT AG, Oberkochen (DE)

(*) Notice: Subject to any disclaimer, the term of this patent is extended or adjusted under 35 U.S.C. 154(b) by 0 days.

(21) Appl. No.: 10/004,674

(22) Filed: Dec. 3, 2001

(65) Prior Publication Data

US 2002/0145718 A1 Oct. 10, 2002

Related U.S. Application Data

(63) Continuation-in-part of application No. 09/503,640, filed on Feb. 14, 2000, now Pat. No. 6,353,470.

(30) Foreign Application Priority Data

Feb. 15, 1999 (DE) .......................................... 199 06 001
Oct. 7, 1999 (DE) .......................................... 199 48 240

(51) Int. Cl.[7] .................. G03B 27/54; G03B 27/72; G02B 5/10
(52) U.S. Cl. ............................. 355/67; 355/71; 359/859
(58) Field of Search ............................. 355/52–53, 55, 355/67–71, 77; 359/365, 631, 686, 859; 250/492.2

(56) References Cited

U.S. PATENT DOCUMENTS

| | | |
|---|---|---|
| 5,272,568 A | 12/1993 | DeJager |
| 5,686,728 A | 11/1997 | Shafer |
| 5,815,310 A | 9/1998 | Williamson |

FOREIGN PATENT DOCUMENTS

| | | |
|---|---|---|
| EP | 0 779 528 | 6/1997 |
| EP | 0 779 528 A2 | 6/1997 |
| JP | 07283116 | 10/1995 |
| WO | WO 99/57606 | 11/1999 |

OTHER PUBLICATIONS

European Search Report for Application No. 99125783.3–2208.

Jewell, "Optical system design issues in development of projection camera for EUV lithography," *Proceedings of the SPIE* 2437:340–346 (1995).

Primary Examiner—Henry Hung Nguyen
(74) Attorney, Agent, or Firm—Marshall, Gerstein & Borun

(57) ABSTRACT

A microlithography reduction objective formed from six mirrors arranged in a light path between an object plane and an image plane is provided. The microlithography reduction objective is characterized by having an image-side numerical aperture NA≧0.15. In some embodiments, the mirror closest to the image plane, i.e., the fifth mirror is arranged such that an image-side optical free working distance is greater than or equal to a used diameter of a physical mirror surface of the fifth mirror, a physical mirror surface being the area of a mirror where light rays from the object impinge. The fifth mirror may be arranged such that an image-side optical free working distance is greater than or equal to the sum of one-third the used diameter of the physical mirror surface on the fifth mirror and a length between 20 mm and 30 mm. The fifth mirror may be arranged such that the image-side optical free working distance is at least 50 mm, as well. The image-side free working distance is the physical distance between the vertex of the surface of the fifth mirror and the image plane. Other embodiments are described.

14 Claims, 6 Drawing Sheets

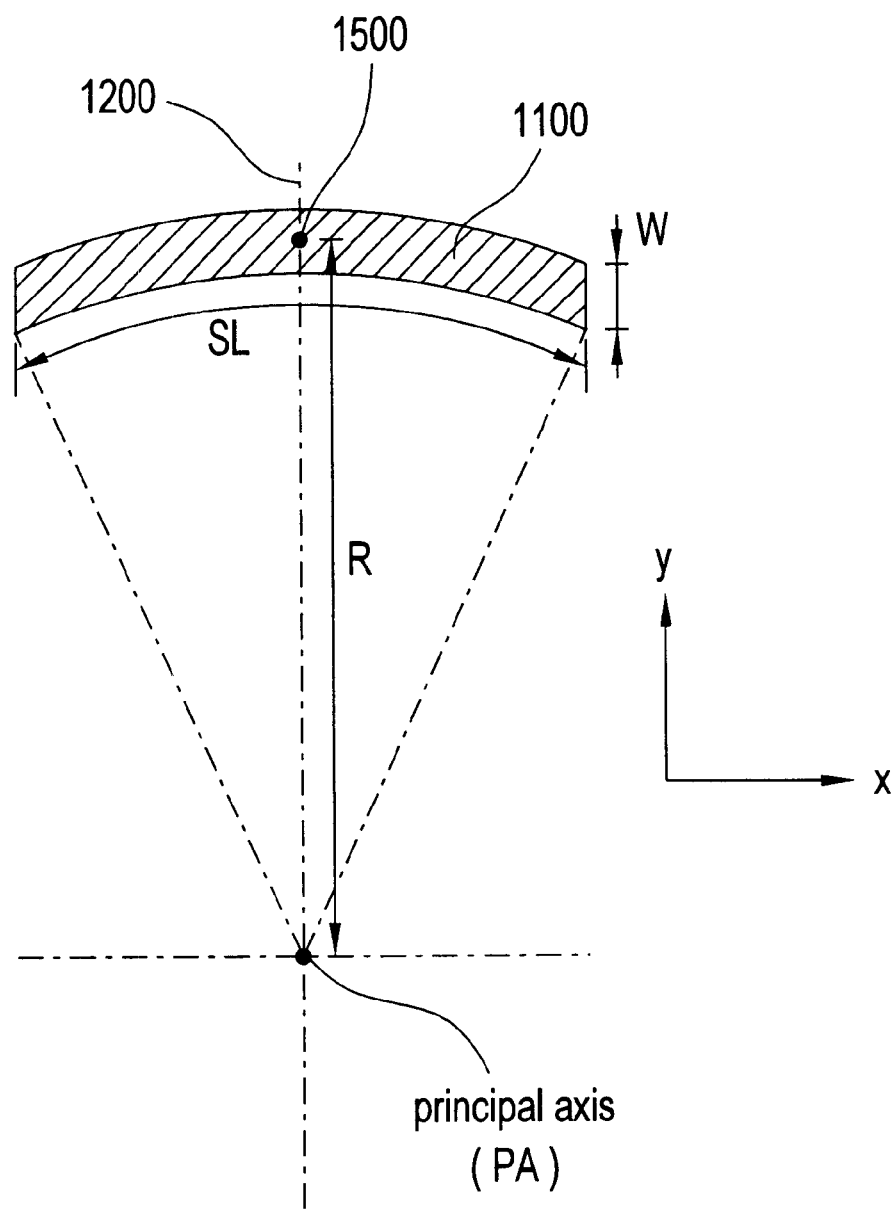

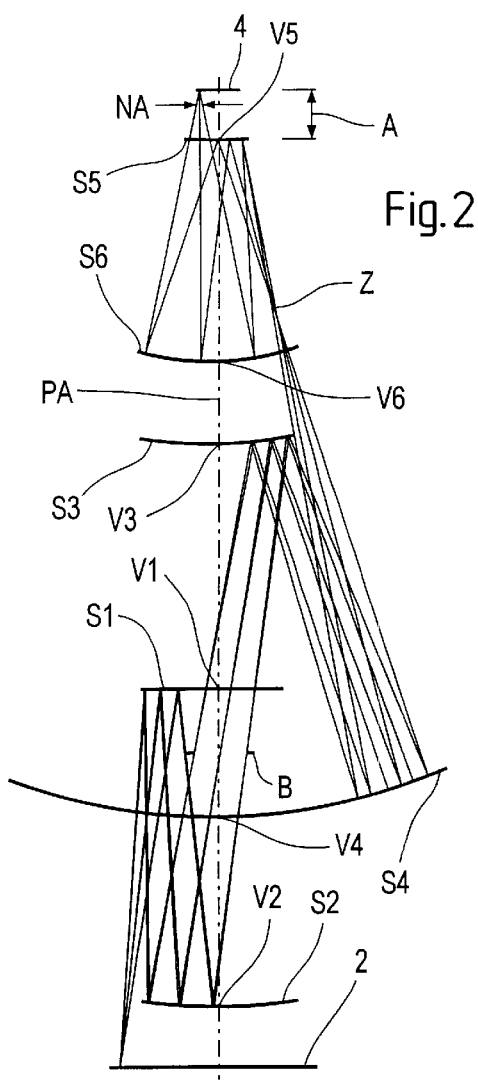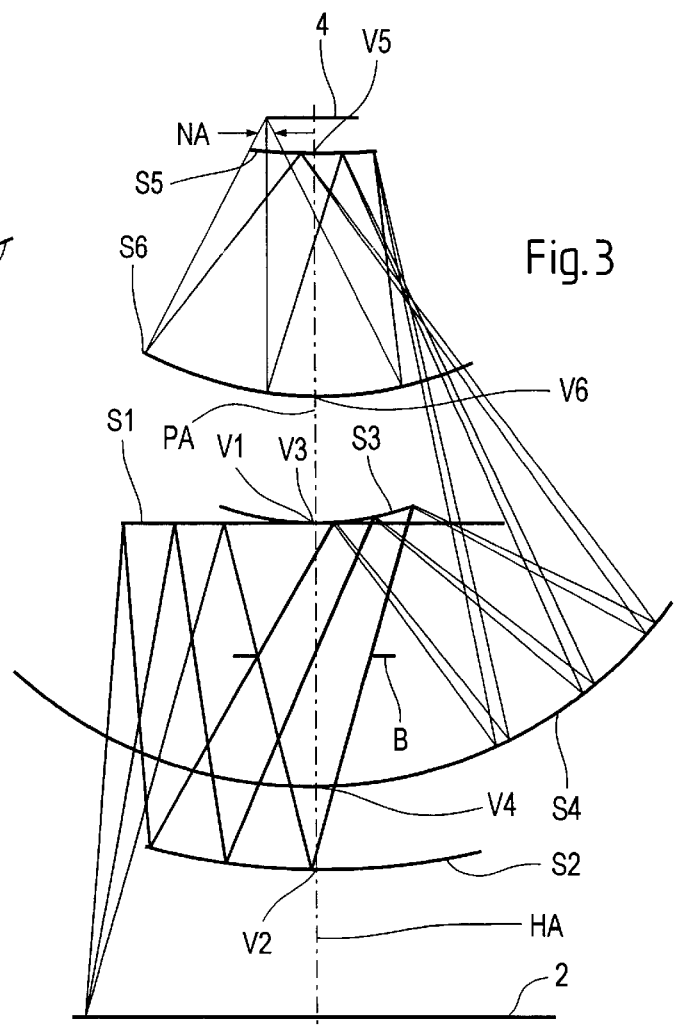
PRIOR ART

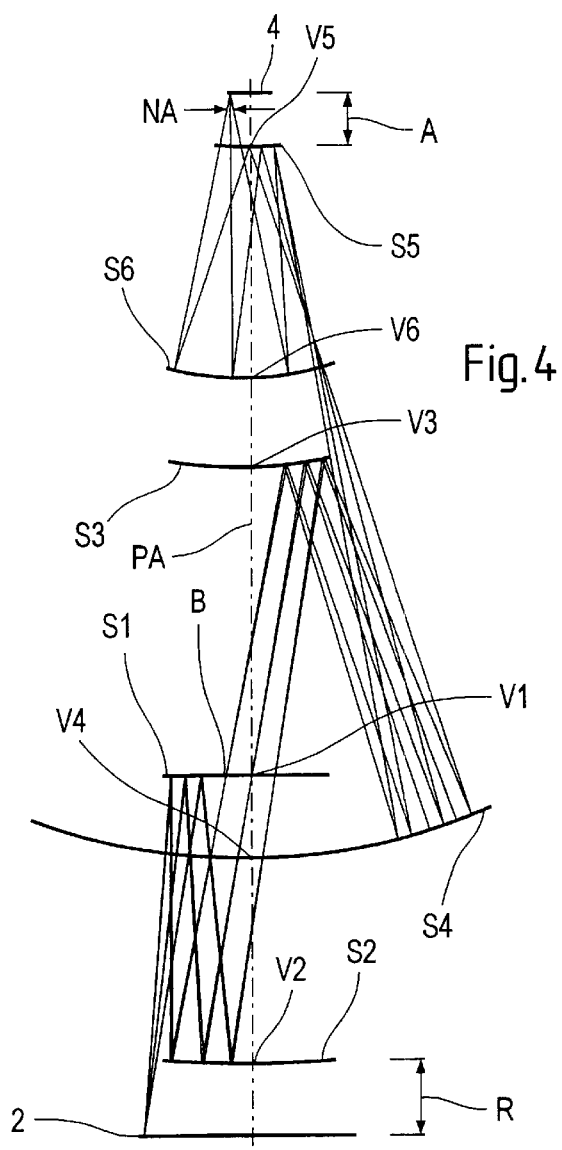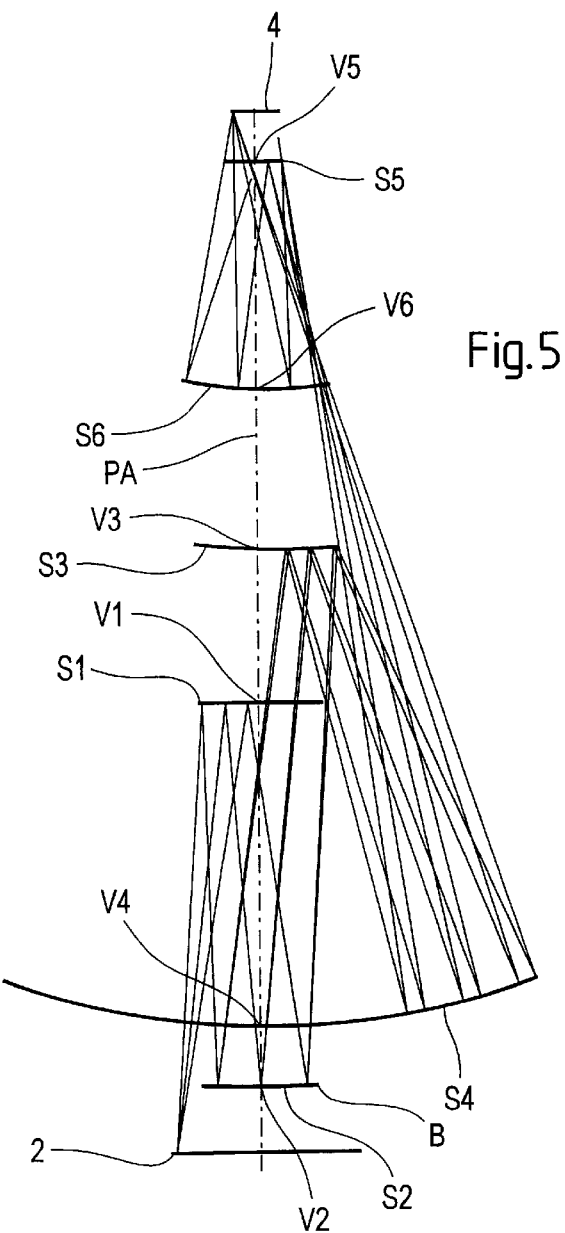

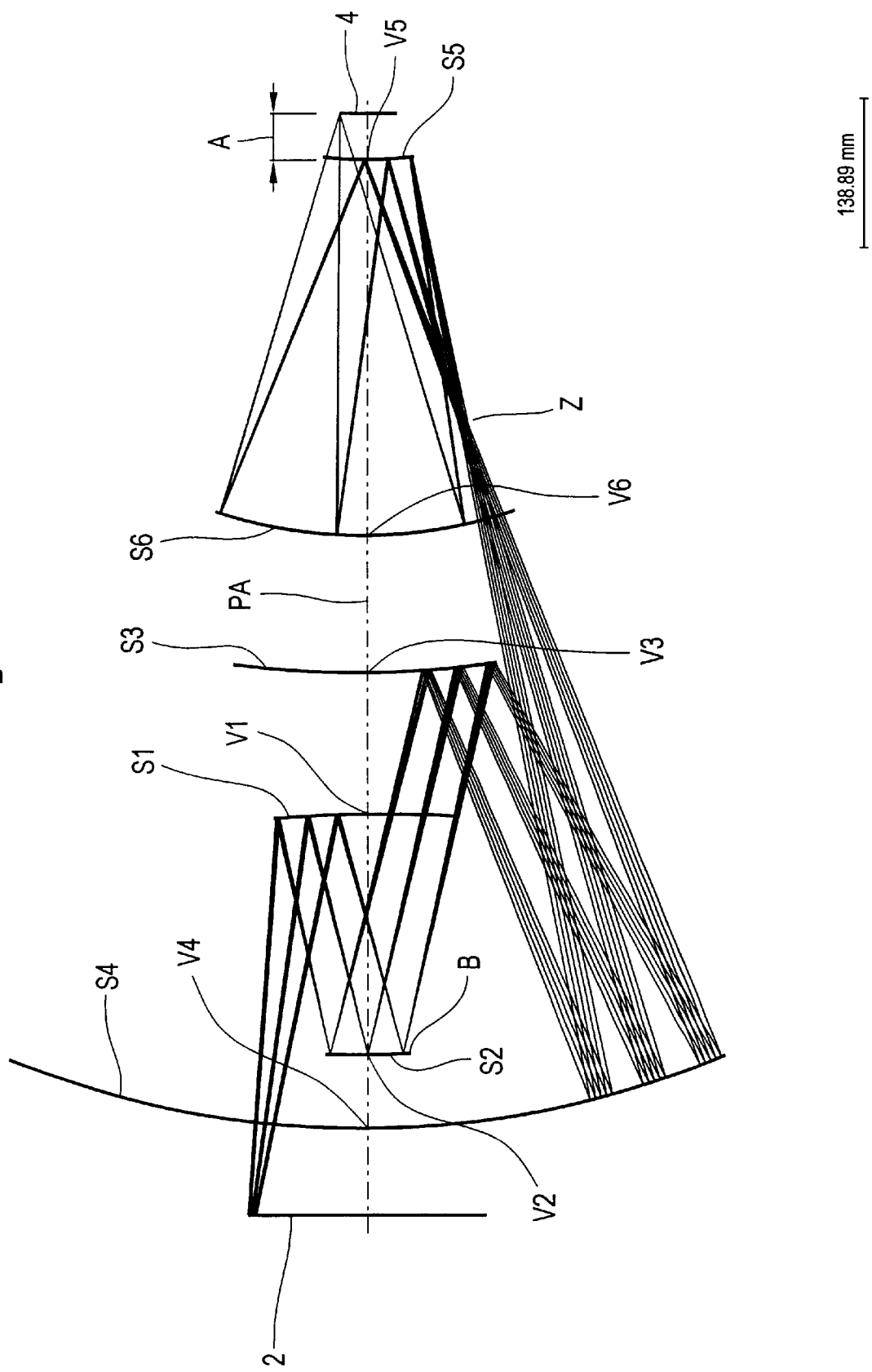

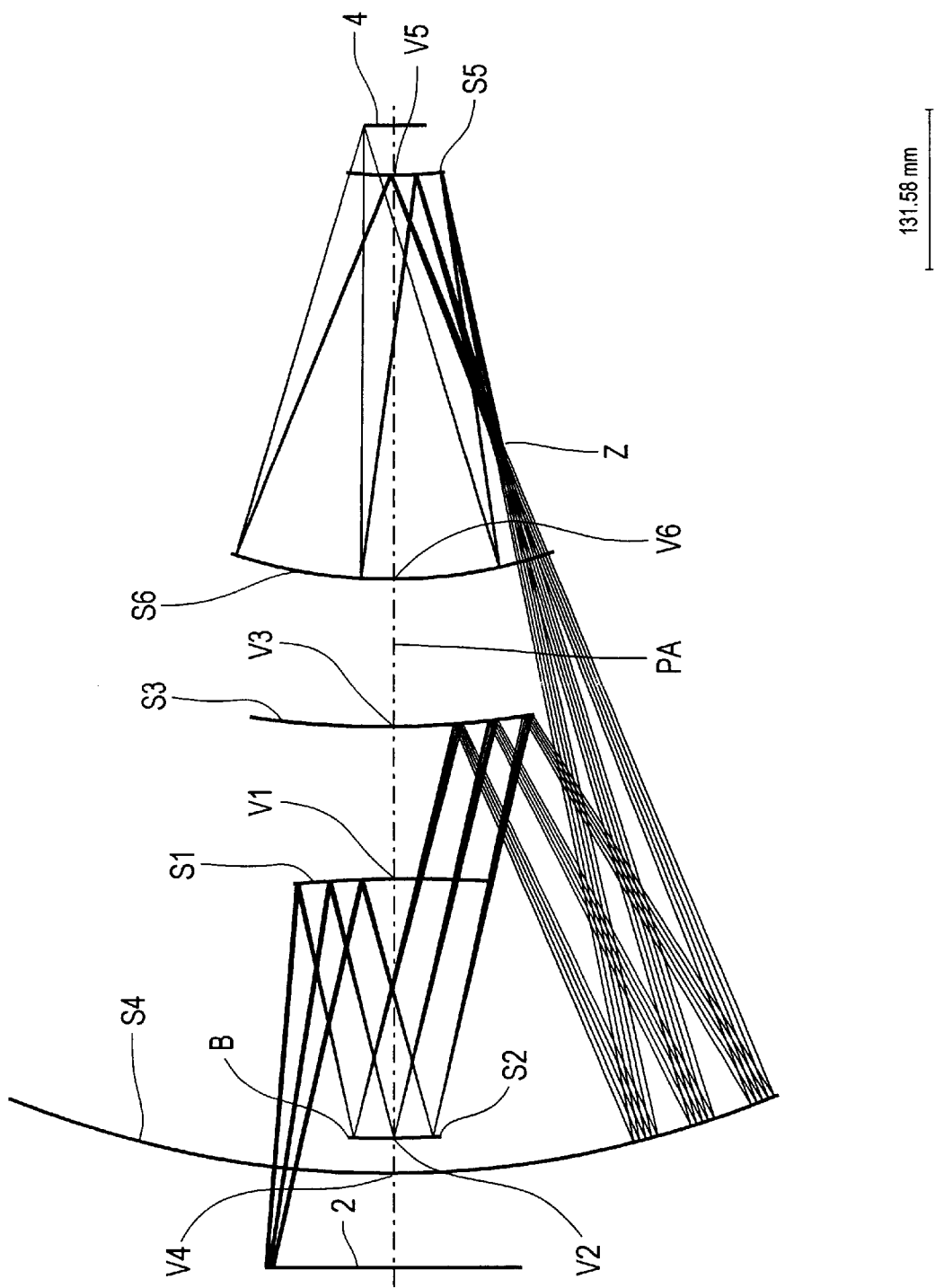

MICROLITHOGRAPHY REDUCTION OBJECTIVE AND PROJECTION EXPOSURE APPARATUS

This is a Continuation-In-Part of U.S. application Ser. No. 09/503,640, filed Feb. 14, 2000, now U.S. Pat. No. 6,353,470.

FIELD OF THE INVENTION

The invention relates to a microlithography objective, a projection exposure apparatus containing the objective, and a method of manufacturing an integrated circuit using the same.

BACKGROUND OF THE INVENTION

Using a lithography system operating with wavelengths below 193 nm for imaging structures of below 130 nm resolution has been proposed. In fact, such lithography systems have been suggested for the extreme ultraviolet (EUV) range with wavelengths of $\lambda=11$ nm or $\lambda=13$ nm producing structures of below 100 nm. The resolution of a lithographic system is described by the following equation:

$$RES = k_1 \cdot \lambda / NA$$

where $k_1$ is a specific parameter of the lithographic process, $\lambda$ is the wavelength of the incident light, and NA is the image-side numerical aperture of the system. For example, if one assumes a numerical aperture of 0.2, then the imaging of 50 nm structures with 13 nm radiation requires a process with $k_1=0.77$. With $k_1=0.64$, the imaging of 35 nm structures is possible with 11 nm radiation.

For imaging systems in the EUV region, substantially reflective systems with multilayer coatings are available as optical components. Preferably multilayers of Mo/Be are used as multilayer coating systems for systems operating at $\lambda=11$ nm, whereas Mo/Si systems are used for $\lambda=13$ mm. Since the reflectivity of the multilayer coatings is approximating 70%, it is desirable to use as few optical components as possible in e.g. an EUV projection microlithography objective to achieve sufficient light intensity. Specifically, to achieve high light intensity and to allow for the correction of imaging errors, systems with six mirrors and a image side numerical aperture (NA)=0.20 have been used.

Six-mirror systems for microlithography have become known from the publications U.S. Pat. No. 5,686,728, EP 779,528 and U.S. Pat. No. 5,815,310. The projection lithography system according to U.S. Pat. No. 5,686,728 has a projection objective with six mirrors, where each of the reflective mirror surfaces has an aspherical form. The mirrors are arranged along a common optical axis in such a way that an obscuration-free light path is achieved. Since the projection objective known from U.S. Pat. No. 5,686,728 is used only for UV light with a wavelength of 100–300 nm, the mirrors of this projection objective have a very high asphericity of approximately ±50 $\mu$m as well as very large angles of incidence of approximately 38°. Even after reducing the image side aperture to NA=0.2, an asphericity of 25 $\mu$m from peak to peak remains, with a barely reduced angle of incidence. Such asphericities and angles of incidence are not practicable in the EUV region due to the high requirements for surface quality and reflectivity of the mirrors.

Another disadvantage of the objectives disclosed in U.S. Pat. No. 5,686,728, which precludes their use with wavelengths below 100 nm such as the 11 nm and 13 nm wavelengths desirable for EUV microlithography, is the short distance between the wafer and the mirror arranged next to the wafer. In the case of U.S. Pat. No. 5,686,728, due to this short distance between the wafer and the mirror next to the wafer, the mirrors could be made only very thin. Due to the extreme layer stress in the multilayer systems discussed for 11 nm or 13 nm wavelengths, such thin mirrors are very unstable.

A projection objective with six mirrors for use in EUV lithography, particularly also for wavelengths of 13 nm and 11 nm, has become known from EP 779,528. This projection objective also has the disadvantage that at least two of the six mirrors have very high asphericities of 26 and 18.5 $\mu$m. However, even in the EP 779,528 arrangement, the optical free working distance between the mirror next to the wafer and the wafer itself is so small that either instabilities occur or the mechanical free working distance is negative.

Thus, it is desirable to provide a projection objective for lithography with short wavelengths, preferably smaller than 100 nm, which does not have the disadvantages of the state of the art described above.

SUMMARY OF THE INVENTION

According to one aspect of the invention, the shortcomings of the prior art are overcome by a projection objective having an object plane and an image plane and a light path for a bundle of light rays from the object plane to the image plane. The six mirrors of the objective are arranged in the light path from the object plane to the image plane. According to the invention the mirror closest to the image plane where e.g. an object to be illuminated such as a wafer is situated is arranged in such a way that an image-side numerical aperture is $NA \geq 0.15$. In this application the image-side numerical aperture is understood to be the numerical aperture of the bundle of light rays impinging onto the image plane. Furthermore, the mirror arranged closest to the image plane of the objective is arranged in such a way that the image-side free working distance corresponds at least to the used diameter of the mirror next to the wafer. In a preferred embodiment the image-side free working distance is at least the sum of one-third of the used diameter of the mirror next to the image plane and a length between 20 and 30 mm. In an alternative embodiment the image-side free working distance is at least 50 mm. In a particularly preferred embodiment, the image-side free working distance is 60 mm. In this application the free working distance is defined as the distance of the vertex of the surface of the mirror next to the image plane and the image plane. All surfaces of the six mirrors in this application are rotational-symmetric about a principal axis (PA). The vertex of a surface of a mirror is the intersection point of the surface of a mirror with the principal axis (PA). Each mirror has a mirror surface. The mirror surface is the physical mirror surface upon which the bundle of light rays traveling through the objective from the object plane to the image plane impinge. The physical mirror surface or the used area of a mirror can be an off-axis or an on-axis mirror segment relative to the principal axis (PA).

According to another aspect of the invention, a projection objective that comprises six mirrors is characterized by an image-side numerical aperture, NA, greater than 0.15 and an arc-shaped field width, W, at the wafer in the range 1.0 mm $\leq$ W. The peak-to-valley deviation, A, of the aspheres are limited with respect to the best fitting sphere of the physical mirror surface of all mirrors by:

$A \leq 19\ \mu m - 102\ \mu m\ (0.25 - NA) - 0.7\ \mu m/mm\ (2\ mm - W).$

In a preferred embodiment, the peak-to-valley distance A of the aspheres is limited with respect to the best fitting sphere of the off-axis segments of all mirrors by:

$A \leq 12\ \mu m - 64\ \mu m\ (0.25 - NA) - 0.3\ \mu m/mm\ (2\ mm - W).$

According to yet another aspect of the invention, a projection objective that includes six mirrors is characterized by an image-side numerical aperture NA≧0.15 and an image-side width of the arc-shaped field W≧1 mm, and the angles of incidence AOI are limited for all rays of the light bundle impinging a physical mirror surface on all six mirrors S1, S2, S3, S4, S5, S6 by:

$$AOI \leq 23°-35°(0.25-NA)-0.2°/mm(2\ mm-W)$$

wherein the angles of incidence AOI refer to the angle between the incident ray and the normal to the physical mirror surface at the point of incidence. The largest angle of any incident bundle of light rays occurring on any of the mirrors is always given by the angle of a bundle-limiting ray.

Preferably, an embodiment of the invention would encompass all three of the above aspects, e.g., an embodiment in which the free optical working distance would be more than 50 mm at NA=0.20 and the peak-to-valley deviation of the aspheres, as well as the angles of incidence, would lie in the regions defined above.

The asphericities herein refer to the peak-to-valley (PV) deviation, A, of the aspherical surfaces with respect to the best fitting sphere of the physical mirror surface of an specific mirror. The physical mirror surface of a specific mirror is also denoted as the used area of this specific mirror. The aspherical surfaces are approximated in the examples by using a sphere. The sphere has a center on the figure axis vertex of the mirror. The sphere intersects the asphere in the upper and lower endpoint of the used area in the meridian section. The data regarding the angles of incidence always refer to the angle between the incident ray and the normal to the physical mirror surface at the point of incidence. The largest angle of any incident bundle of light rays occurring on any of the physical mirror surfaces is always given by the angle of a bundle-limiting ray. The used diameter or the diameter of the physical mirror surface will be defined here and below as the envelope circle diameter of the physical mirror surface or the used area of a mirror, which is generally not circular.

In a preferred embodiment, the free working distance is 60 mm.

The objective can be used not only in the EUV, but also at other wavelengths, without deviating from the scope of the invention. In any respect, however, to avoid degradation of image quality, especially degradation due to central shading, the mirrors of the projection objectives should be arranged so that the light path of the bundle of light rays traveling from the object plane to the image plane is obscuration-free. Furthermore, to provide easy mounting and adjusting of the system, the physical mirror surfaces have a rotational symmetry to a principal axis (PA). Moreover, to have a compact design with an accessible aperture and to establish an obscuration-free light path of the bundle of light rays traveling from the object plane to the image plane, the projection objective device is designed in such a way that an intermediate image of the object situated in the object plane is formed after the fourth mirror. In such systems, it is possible that the aperture stop is situated in the front, low-aperture objective part, with a pupil plane conjugated to the aperture stop imaged in the focal plane of the last mirror. Such a system ensures telecentricity in the image plane.

In a preferred embodiment of the invention, the aperture stop is freely accessible and arranged in the light path from the object plane to the image plane between the second and third mirror. Good accessibility of the aperture stop is ensured when the ratio of the distance between the first and third mirror to the distance between the first and second mirror lies in the range of:

$$0.5<S1S3/S1S2<2.$$

As defined for the free working distance in general a distance between two mirrors is the distance of the vertices of the surfaces of these mirrors.

Furthermore, in order to prevent vignetting of the light running from the third to the fourth mirror, by the aperture stop arranged between the second and third mirror, the ratio of the distance between the second mirror and aperture stop to the distance between the third mirror and the aperture stop lies in the range:

$$0.5<S2\ \text{aperture}/(S3\ \text{aperture})<2.$$

In such a system, the angles of incidence on the physical mirror surfaces in the front part of the objective are reduced.

An aperture stop which physically lies between the second mirror, S2, and the first mirror, S1, must be formed at least partially as a narrow ring in order to avoid clipping of light moving from S1 to S2. In such a design, there is a danger that undesirable direct light or light reflected on S1 and S2, will pass outside the aperture ring and reach the image plane and thus the wafer. However, if the aperture stop is placed in the light path between the second and third mirror and physically close to the first mirror (which can be easily achieved mechanically), an efficient masking of this undesired light is possible. The aperture stop can be designed both as an opening in the first mirror or an opening which is arranged behind the first mirror.

In another embodiment of the invention, the aperture stop is arranged on or near the second mirror. Arrangement of the aperture on a mirror has the advantage that it is easier to manufacture.

In order to ensure an obscuration-free ray path with simultaneously low angles of incidence, the ratio of the distance between the first and third mirrors (S1S3) to the distance between the first and second mirrors (S1S2) lies in the range:

$$0.3 \leq S1S3/S1S2 \leq 2.0,$$

while the ratio of the distance between the second and third mirrors (S2S3) to the distance between the third and fourth mirrors (S3S4) lies in the range:

$$0.7 \leq S2S3/S3S4 \leq 1.4.$$

In order to be able to make the necessary corrections of imaging errors in the six-mirror systems, in a preferred embodiment, all six mirrors are designed to be aspherical. However, an alternative embodiment whereby at most five mirrors are aspherical can simplify the manufacturing, because it is then possible to design one mirror, preferably the largest mirror, i.e., the quaternary mirror, in the form of a spherical mirror. Moreover, it is preferred that the second to sixth mirror be in a concave-convex-concave-convex-concave sequence.

In order to achieve a resolution of at least 50 nm, the design part of the rms wavefront section of the system should be at most 0.07λ and preferably 0.03 λ.

Advantageously, in the embodiments of the invention, the objectives are always telecentric on the image-side.

In projection systems, which are operated with a reflection mask, a telecentric light path on the object-side is not possible without illumination through a beam splitter, which reduces the transmission strongly. One such device is known from JP 95 28 31 16.

In systems with transmission mask, the projection objective can be telecentric on the object side. In these embodiments, the first mirror is preferably concave.

The telecentericity error in the image plane, where the wafer is situated should not exceed 10 mrad and is typically between 5 mrad and 2 mrad, with 2 mrad being preferred. This ensures that changes of the imaging ratio remain within tolerable limits over the depth of focus.

In an preferred embodiments of the invention, the six mirror objective may include a field mirror, a reducing three-mirror subsystem and a two-mirror subsystem.

In addition to the projection objective according to the invention, the invention also makes available a projection exposure apparatus that includes at least a projection objective device. In a first embodiment, the projection exposure apparatus has a reflection mask, while, in an alternative embodiment, it has a transmission mask. Preferably, the projection exposure apparatus includes an illumination device for illuminating an off-axis arc-shaped field and the system is designed as an arc-shaped field scanner. Furthermore, the secant length of the scan slit is at least 26 mm and the ring width is greater than 0.5 mm.

The invention will be described below with the aid of the drawings as examples.

BRIEF DESCRIPTION OF THE DRAWINGS

FIG. 1 illustrates the ring field in the object plane of the objective.

FIG. 2 illustrates an embodiment of the invention with an intermediate image, a freely accessible aperture stop between a second and third mirror, and a image side numerical aperture of 0.2.

FIG. 3 illustrates a prior art six-mirror objective arrangement for wavelengths>100 nm as disclosed in U.S. Pat. No. 5,686,728.

FIG. 4 illustrates a second embodiment of the invention with an aperture stop between the second and third mirror at the first mirror.

FIG. 5 illustrates a third embodiment of the invention with an aperture stop on the second mirror and a working distance of 59 mm.

FIG. 6 illustrates a fourth embodiment of the invention with an intermediate image, a image side numerical aperture NA of 0.28 as well as a free working distance on the image-side which is at least the sum of one-third of the useful diameter of the mirror nearest to the wafer and a length which lies between 20 and 30 mm.

FIG. 7 illustrates a fifth embodiment of the invention of a system with an intermediate image and a image side numerical aperture NA of 0.30.

DESCRIPTION OF THE PREFERRED EMBODIMENTS

Figure 8A:
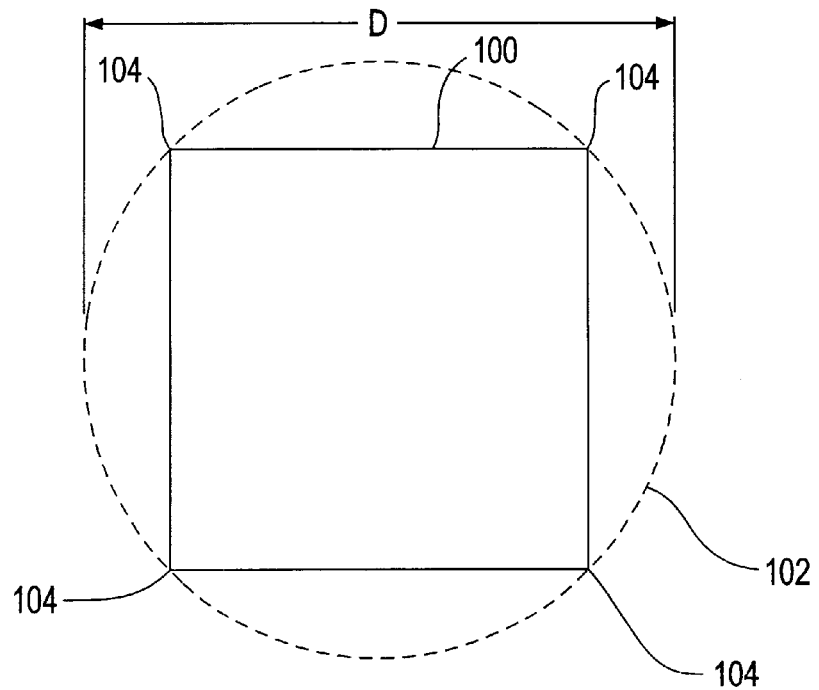
FIGS. 8A and 8B show the used diameter for different physical mirror surfaces or used areas of a mirror

In FIG. 1 the object field 1100 of a projection exposure apparatus in the object plane of the projection objective according to the invention is shown. The object plane is imaged by means of the projection objective in an image plane, in which a light sensitive object, for example a wafer with a light sensitive material is arranged. The image field in the image plane has the same shape as the object field. The object (or the image) field 1100 has the configuration of a segment of a ring field, and the ring field has an axis of symmetry 1200.

In addition the axis 1200 extending to the object plane, the x-axis and the y-axis are depicted. As can be seen from FIG. 1, the axis of symmetry 1200 of the ring field runs in the direction of the y-axis. At the same time the y-axis coincides with the scanning direction of an projection exposure apparatus, which is designed as a ring field scanner. The x-direction is thus the direction that stands perpendicular to the scanning direction, within the object plane. The ring field has a so called ring field radius R, which is defined by the distance of the central field point 1500 of the image field from the principal axis (PA) of the projection objective. The arc-shaped field in the object plane as well as in the image plane has a arc shaped field width W, which is the extension of the field in scanning or y-direction and a secant length SL.

In FIGS. 2, 4 and 5, arrangements of the six-mirror projection objectives according to the invention are shown. Each embodiment has a free working distance that corresponds at least to the used diameter of the physical mirror surface or mirror segment next to the wafer. In contrast, FIG. 3 shows a prior art system for use with wavelengths>100 nm, such as the system of U.S. Pat. No. 5,686,728. In all embodiments below, the same reference numbers will be used for the same components and the following nomenclature will be employed:

first mirror (S1), second mirror (S2), third mirror (S3), fourth mirror (S4), fifth mirror (S5), and sixth mirror (S6).

In particular, FIG. 2 shows a six-mirror projection objective with a ray path from the object plane 2, i.e. reticle plane to the image plane 4, i.e. wafer plane. The embodiment includes a field mirror S1, which forms a virtual image of an object with an imaging ratio β>0. A three-mirror system formed from S2, S3 and S4 is also provided and produces a real, reduced image of the virtual image as the intermediate image, Z. Lastly, a two-mirror system S5, S6, images the intermediate image Z in the wafer plane 4 while maintaining the requirements of telecentricity. The aberrations of the three-mirror and two-mirror subsystems are balanced against one another so that the total system has a high optical quality sufficient for integrated circuit fabrication applications.

The physical aperture stop B is arranged between the second mirror S2 and the third mirror S3. And, as is clear from FIG. 2, the aperture stop is accessible in the ray path between the second mirror S2 and the third mirror S3. Furthermore, the distance between the vertex V5 of the surface of the mirror next to the wafer, i.e., the surface of the fifth mirror S5 in the present embodiment, and the image plane is greater than the used diameter of the physical mirror surface of mirror S5. The used diameter of a physical mirror surface is explained in more detail in the description of FIGS. 8A and 8B. In other words, the following condition is fulfilled:

the physical distance from the vertex V5 of the surface of mirror S5 to the image plane 4 is greater than the used diameter of mirror S5.

Other distance requirements are also possible and may be used, such as the physical distance is (1) greater than the sum of one-third of the used diameter of the mirror next to the wafer, S5, and 20 mm, or (2) greater than 50 mm. In the preferred embodiment, the physical distance is 60 mm.

Such a physical distance guarantees a sufficiently free working distance A, and allows the use of optical components compatible for use with wavelengths<100 nm, and preferably wavelengths of 11 to 13 nm. Optical components in this range include, for example, Mo/Si or Mo/Be multilayer systems, where the typical multilayer systems for $\lambda=13$ nm is Mo/Si layer pairs and for $\lambda=11$ nm, is Mo/Be systems, both of approximately 70 layer pairs. Reflectivities attainable in such systems are approximately 70%. In the multilayer layer systems, layer stresses of above 350 MPa may occur. Stresses of such values may induce surface deformation, especially in the edge regions of the mirror.

The systems according to the invention, as they are shown, for example, in FIG. 1, have:

$$RES=k_1\lambda/NA.$$

This results in a nominal resolution of at least 50 nm and 35 nm at a minimum numerical aperture of NA=0.2 for $k_1$=0.77 and $\lambda$=13 nm, and for $k_1$=0.64 and $\lambda$=11 nm, respectively, where $k_1$ is a parameter specific for the lithographic process.

Furthermore, the light path for a bundle of light rays running from the object plane to the image plane of the objective shown in FIG. 2 is obscuration-free. For example, in order to provide image formats of 26×34 mm$^2$ or 26×52 mm$^2$, the projection objectives according to the invention are preferably used in an arc-shaped field scan projection exposure apparatus, wherein the secant length of the scan slit is at least 26 mm.

Numerous masks can be used in the projection exposure apparatus. The masks or reticle are arranged in the object plane of the projection objective. The masks include transmission masks, stencil masks and reflection masks. The projection objective, which is telecentric on the image side, i.e. in the image plane, can be telecentric or non-telecentric on the object side, i.e. in the object plane depending on which mask is used. For example, if the bundle of light rays is telecentric on the object-side when using a reflection mask, a transmission-reducing beam splitter must be employed. If the bundle of light rays is non-telecentric on the object-side, unevennesses of the mask leads to dimensional errors in the image. Therefore, the angle of incidence of the chief ray of the bundle of light rays through the central field point 1500 in the object plane is preferably below 10°, so that the requirements for reticle evenness lies in an achievable range. Moreover, the system of FIG. 2 which is telecentric on the image side has an image-side error of telecentry at the wafer level of 1 mrad for a image side numerical aperture of 0.2.

Due to the high image-side telecentricity, the entrance pupil of the last mirror S6 is at or near the focal plane of this mirror. Therefore, in systems with an intermediate image as described before, the aperture, B, is in the front, low-aperture objective part preferably in the light path between the first and third mirror S1, S3. Thus the pupil plane conjugated with the aperture stop will be imaged in the focal plane of the last mirror.

All mirrors S1–S6 of FIG. 2 are designed to be aspherical, with a maximum asphericity of approximately 7.3 µm. The low asphericity of the embodiment shown in FIG. 2 is advantageous from a manufacturing point of view, since the technological difficulties in processing the surfaces of the multilayer mirrors increases proportionally with aspherical deviation and gradient of the asphere.

The highest angle of incidence of a ray impinging a mirror surface in the six-mirror objective shown in FIG. 2 occur on the fifth mirror S5 and is approximately 18.4°. The maximum variation of the angles of incidence of the rays within a bundle of light rays impinging onto a mirror surface occurs on mirror surface of mirror S5 and is approximately 14.7°. The wavefront error at $\lambda$=13 nm is better than 0.032$\lambda$; the centroid distortion of the point spread function is <3 mm; and the static, dimension-corrected distortion lies at 4 nm.

A freely accessible aperture stop between the second and third mirror as well as no vignetting of the bundle of light rays running from S3 to S4 by the aperture stop is achieved with small angles of incidence of the rays impinging onto the mirror surfaces when the following distance conditions are fulfilled:

$$0.5<S1S3/S1S2<2$$

and $$0.5<S2 \text{ aperture}/(S3 \text{ aperture})<2.$$

Here, the abbreviation S1S3 means the mechanical distance or physical distance between the vertices V1 and V3 of the surface of the mirrors S1 and S3. And, "S2 aperture" means the mechanical distance between the vertex V2 of the surface of mirror S2 and the aperture. Furthermore, in order to reduce the angles of incidence on the mirrors in any of the embodiments of FIGS. 2, 4, and 5, the distance from the object plane, where for example the reticle is situated to the vertex of the surface of the mirror S1, is made smaller than the mechanical distance from the vertex of the surface of mirror S2 to the vertex of the surface of mirror S3, i.e., the following applies:

$$\text{reticle } S1 < S2S3.$$

To ensure a sufficient free working distance A not only on the image side but also on the object side the reticle is situated sufficiently far in front of the first mirror next to the object plane, which is in the present case the surface of the second mirror S2. In the present case, for example, the physical distance between the reticle and the vertex V2 of the surface of mirror S2 is 80 mm.

Furthermore, in the embodiments of FIGS. 2 and 4 to 6, the physical distance between the mirrors S3 and S6 is chosen so that mirrors of sufficient thickness can be used. Thicker mirrors have sufficient strength and stability properties that can withstand the high layer tensions described above. In these systems, the following relationship is preferred:

$$0.3 \text{ (used diameter } S3+\text{used diameter } S6)<S3S6.$$

Here S3S6 denotes the physical distance between the vertex V3 of the surface of mirror S3 and the vertex V6 of the surface of the mirror S6.

In the following table, the parameters of the system represented in FIG. 2 are exemplarily shown in Code V(™) nomenclature. The objective is a 5× system with a 26×2 mm$^2$ arc-shaped field in the image plane, wherein 26 mm is the secant length of the arc-shaped field and 2 mm is the width W of the arc shaped field. Furthermore the numerical aperture is 0.2 on the image side. The mean image side radius of the system is approximately 26 mm.

TABLE 1

| element No. | radius | Thickness | diameter | Type |
|---|---|---|---|---|
| object | INF | 80.9127 | | |
| | | 413.0257 | 258.1723 | |

TABLE 1-continued

| | | | | |
|---|---|---|---|---|
| S1 | A(1) | −88.8251 | 197.5712 | REFL |
| | | | 195.6194 | |
| | | −324.2006 | | |
| | | | 188.6170 | |
| | | 0.0000 | | |
| S2 | A(2) | 324.2006 | 188.7078 | REFL |
| | | aperture | 67.1796 | |
| | | 423.6214 | | |
| | | | 183.2180 | |
| | | 0.0000 | | |
| S3 | A(3) | −423.6214 | 184.7062 | REFL |
| | | | 519.0546 | |
| | | −74.9270 | | |
| S4 | A(4) | 498.5484 | 541.0453 | REFL |
| | | | 248.6244 | |
| | | 109.8242 | | |
| | | | 177.5488 | |
| | | 281.5288 | | |
| S5 | A(5) | −281.5288 | 65.0842 | REFL |
| S6 | A(6) | 281.5288 | 187.9549 | REFL |
| | | | 78.3999 | |
| image | image width | 59.9202 | | |
| | | | 53.9889 | | aspherical constants:

$$Z = (CURV)\, Y^2/[1 + (1 - (1 + K)(CURV)^2\, Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00031800 | −27.686599 | 0.00000E+00 | 1.32694E−15 | 2.00546E−20 | −8.49471E−25 |
| A(2) | 0.00094928 | −3.998204 | 0.00000E +00 | 4.03849E−15 | −6.15047E−20 | 2.73303E−25 |
| A(3) | 0.00126752 | 0.424198 | 0.00000E+00 | 1.58766E−15 | −8.27965E−20 | 2.80328E−24 |
| A(4) | 0.00123850 | 0.023155 | 0.00000E+00 | 2.46048E−17 | −1.08266E−22 | 3.75259E−28 |
| A(5) | 0.00329892 | 2.902916 | 0.00000E+00 | 1.55628E−12 | −6.71619E−17 | −5.30379E−21 |
| A(6) | 0.00277563 | 0.072942 | 0.00000E+00 | 2.96285E−16 | 3.99125E−21 | 4.55007E−26 |

Reference wavelength = 13 nm

FIG. 3 shows an arrangement of a projection objective for microlithography with a wavelength of λ<100 nm according to U.S. Pat. No. 5,686,728. By way of a simplified explanation and comparison only, components similar to those of FIG. 1 are provided with the same reference numbers. As is clear, the physical distance between the vertex V5 of the surface of the mirror next to the image plane S5 and the image plane, where the wafer is situated, is significantly smaller than the used diameter of the fifth mirror S5, lying mainly in the range of approximately 20 mm. This leads to strength and stability problems for the optics in the EUV region because of the extreme tensions in the layers. Furthermore, the system has very high asphericities of ±50 μm and a maximum angle of incidence of 38°. From a manufacturing and coating technology point of view, such asphericities and angles of incidence are incompatible for use in the EUV region.

FIG. 4 is an alternative embodiment of a six-mirror system in which the aperture stop is situated on the first mirror. The same components as in FIG. 2 again receive the same reference number in FIG. 4. The free working distance A to the wafer is 60 mm in this embodiment, as it was in the embodiment of FIG. 2, and thus it is greater than the used diameter of the mirror next to the wafer, S5. Similarly, as with FIG. 2, the physical distance between the vertex V2 of the surface of mirror S2 and the vertex V3 of the surface of mirror S3 was increased significantly in comparison to that of U.S. Pat. No. 5,686,728, so that large angles of incidence can be avoided in the system.

One difference to the objective of FIG. 2, is that in FIG. 4 the aperture stop B is placed on the first mirror S1. As a result of this position, a reduction in vignetting from the light reflected on S2 is possible, whereas with the physical aperture stop positioned between S1 and S2 light of the bundle of light rays running thorough the objective could pass above the aperture stop which is designed as a narrow ring. In the embodiment shown in FIG. 4, the aperture can be either an opening in the S1 mirror or an aperture disposed behind SI close to this mirror.

Another advantage of this embodiment is the spherical design of mirror S4, which presents advantages especially from the point of view of manufacturing, because mirror S4 is the largest mirror of the system. With such a design, the asphericity in the used range is increased slightly to 10.5 μm. The largest angle of incidence occurs on mirror S5 and is approximately 18.6°. The wavefront error of the arrangement is 0.032 λ, within a 1.7 mm wide arc-shaped field at λ=13 nm. Furthermore, if the mirror S4 is designed to be slightly aspherical with 0.4 μm, then the wavefront error can be kept to 0.031λ within a 1.8 mm wide arc-shaped field at λ=13 nm. Efficient masking of the undesirable light is obtained not only when the aperture stop is formed directly on mirror S1, but also when it is arranged behind, i.e., after, mirror S1. Preferably, the aperture stop is positioned such that the following relationship is obtained:

$$S2S1 \leq 0.9 \times S2 \text{ aperture.}$$

S2S1 denotes the mechanical distance of the vertex V2 of the surface of mirror S2 and the vertex V1 of the surface of the mirror S1.

Table 2 shows the constructional data of the 5× objective according to FIG. 4 in Code V(™) nomenclature, where the fourth mirror S4 is spherical. The mean radius of the 26×1.7 mm image field is approximately 26 mm.

TABLE 2

| element No. | radius | Thickness | diameter | type |
|---|---|---|---|---|
| Object | INF | 85.2401 | | |
| | | | 256.1389 | |
| | | 358.4668 | | |
| S1 | A(1) | 0.0024 | 203.8941 | REFL |
| | | | 203.8845 | |
| | | −358.4691 | | |
| | | | 201.9677 | |
| | | 0.0000 | | |
| S2 | A(2) | 358.4691 | 201.9942 | REFL |
| | | aperture | 60.7572 | |
| | | 390.5456 | | |
| | | | 187.2498 | |
| | | 0.0000 | | |
| S3 | A(3) | −390.5456 | 188.9474 | REFL |
| | | | 505.8686 | |
| | | −104.1273 | | |
| S4 | A(4) | 494.6729 | 550.3686 | REFL |
| | | | 256.9217 | |
| | | 114.3062 | | |
| | | | 181.7337 | |
| | | 281.6969 | | |
| S5 | A(5) | −281.6969 | 64.4286 | REFL |
| S6 | A(6) | 281.6969 | 187.8549 | REFL |
| | | | 78.1545 | |
| image | image width | 60.0041 | | |
| | | | 53.6996 | | aspherical constants:

$Z = (CURV)Y^2/[1 + (1 − (1 + K)(CURV)^2Y^2)^{1/2}] + (A)Y^4 + (B)Y^6 + (C)Y^8 + (D)Y^{10}$

| asphere | CURV | K | A | B | C | D |
|---|---|---|---|---|---|---|
| A(1) | 0.00035280 | −58.238840 | 0.00000E + 00 | 2.14093E − 15 | 2.29498E − 20 | 0.00000E + 00 |
| A(2) | 0.00097971 | −4.160335 | 0.00000E + 00 | 1.54696E − 15 | 8.15622E − 21 | 0.00000E + 00 |
| A(3) | 0.00117863 | −2.136423 | 0.00000E + 00 | −1.78563E − 16 | 3.45455E − 20 | 0.00000E + 00 |
| A(4) | 0.00124362 | 0.000000 | 0.00000E + 00 | 0.00000E + 00 | 0.00000E + 00 | 0 00000E + 00 |
| A(5) | 0.00338832 | 2.909987 | 0.00000E + 00 | 7.90123E − 13 | 7.04899E − 17 | 0.00000E + 00 |
| A(6) | 0.00278660 | 0.062534 | 0.00000E + 00 | 2.79526E − 16 | 7.00741E − 21 | 0.00000E + 00 |

Reference wavelength = 13 nm

Another embodiment is shown in FIG. 5, where again the same reference numbers are used for the same components as in the previous figures. Here, the aperture stop B is placed optically and physically on the secondary mirror or second mirror S2. The ability to place the aperture stop on S2 makes manufacturing easier. Therefore this arrangement is advantageous. The system of FIG. 5 is a 4× reduction system with a wavefront error of 0.021λ within a 2 mm wide image side arc-shaped field at λ=13 nm. The maximum asphericity in the used range lies at 11.2 μm, and the largest angle of incidence, which occurs at S5, is approximately 18.3°. The ring field radius R as defined in FIG. 1 of the arc-shaped field in the image plane is approximately 26 mm, as with the previous two embodiments. Furthermore, the distance between the image plane and the vertex V5 of the surface of the mirror next to the image plane, S5, is greater than the used diameter of the mirror next to the wafer, S5, and lies at around 59 mm in this embodiment.

Table 3 shows the optical parameters of the embodiment of FIG. 5 in Code V(™) nomenclature.

TABLE 3

| element No. | Radius | thickness | diameter | Type |
|---|---|---|---|---|
| object | INF | 84.0595 | | |
| | | | 205.6642 | |
| | | 473.5521 | | |
| S1 | A(1) | −145.8261 | 147.3830 | REFL |
| | | | 136.4700 | |
| | | −327.7260 | | |
| | | aperture | 112.0176 | |
| | | 0.0000 | | |
| S2 | A(2) | 473.5521 | 112.1228 | REFL |
| | | | 163.5236 | |
| | | 190.4830 | | |
| | | | 184.4783 | |
| | | 0.0000 | | |
| S3 | A(3) | −190.4830 | 185.3828 | REFL |
| | | | 358.6720 | |
| | | −399.1713 | | |

TABLE 3-continued

| S4 | A(4) | 589.6560 | 654.5228 | REFL |
|---|---|---|---|---|
| | | | 310.1977 | |
| | | 207.5220 | | |
| | | | 175.3066 | |
| | | 276.2668 | | |
| S5 | A(5) | −276.2668 | 65.2138 | REFL |
| S6 | A(6) | 276.2668 | 182.8159 | REFL |
| | | | 77.5085 | |
| image | image width | 59.0000 | | |
| | | | 53.9968 | | aspherical constants:

$$Z = (CURV)Y^2/[1 + (1 - (1 + K)(CURV)^2Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00015851 | 441.008070 | 0.00000E + 00 | −3.49916E − 16 | 1.27478E − 19 | −3.37021E − 25 |
| A(2) | 0.00089932 | −5.032907 | 0.00000E + 00 | −6.95852E − 15 | −7.53236E − 20 | −2.74751E − 24 |
| A(3) | 0.00188578 | 0.913039 | 0.00000E + 00 | −1.60100E − 15 | −9.53850E − 20 | 1.30729E − 26 |
| A(4) | 0.00108147 | 0.038602 | 0.00000E + 00 | 2.48925E − 18 | −5.29046E − 24 | −4.37117E−31 |
| A(5) | 0.00269068 | 7.253316 | 0.00000E + 00 | −5.70008E − 13 | −9.32236E − 17 | −6.09046E − 21 |
| A(6) | 0.00281036 | 0.150957 | 0.00000E + 00 | 1.30822E− 15 | 1.86627E − 20 | 5.08158E − 25 |

Reference wavelength = 13 nm

FIG. 6 shows an embodiment of the invention which includes a field mirror S1, a first subsystem with the second to fourth mirror S2–S4 and a second subsystem with the fifth and sixth mirror, S5, S6. The field mirror S1 with imaging ratio,β, β>0 produces a virtual image of the object in the object plane 2. The virtual image is then imaged by the first subsystem consisting of the second, third and fourth mirrors, S2, S3, S4, which has β<0, producing a real intermediate image Z in a plane conjugate to the object plane 2. The real intermediate image Z is imaged as a real image into image plane 4 by the second subsystem, which consists of the fifth and sixth mirrors, S5, S6. The image side numerical aperture of the system is NA=0.28. The optical free working distance,s A, between the vertex of the surface of the last mirror S5 and the image plane 4 corresponds to at least the sum of one-third of the used diameter of the mirror nearest to the image plane and a length which lies between 20 and 30 mm. The aperture stop B is situated on the second mirror S2.

Table 4 shows the optical parameters of the embodiment of FIG. 6 in Code V(™) nomenclature.

TABLE 4

| element No. | Radius | thickness | Diameter | Type |
|---|---|---|---|---|
| Object | INF | 151.2625 | | |
| | | | 194.7605 | |
| | | 229.0820 | | |
| S1 | A(1) | −39.4068 | 162.9862 | REFL |
| | | | 147.1426 | |
| | | −189 6752 | | |
| | | aperture | 65.0637 | |
| | | 0.0000 | | |
| S2 | A(2) | 229.0820 | 65.1650 | REFL |
| | | | 168.3504 | |
| | | 137.5708 | | |
| | | | 230.5128 | |
| | | 0.0000 | | |
| S3 | A(3) | −137.5708 | 234.0072 | REFL |
| | | | 386.2567 | |
| | | −300.3445 | | |
| S4 | A(4) | 437.9153 | 630.7784 | REFL |
| | | | 343.1578 | |
| | | 133.0981 | | |
| | | | 257.0225 | |
| | | 353.0840 | | |
| S5 | A(5) | −353.0840 | 79.9521 | REFL |
| S6 | A(6) | 353.0840 | 264.2853 | REFL |
| | | | 78.6376 | |
| image | image width | 44.0000 | | |
| | | | 54.0051 | | aspherical constants:

$$Z = (CURV)Y^2/[1 + (1 + (1 + K)(CURV)^2Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| | K | A | B | C | D |
|---|---|---|---|---|---|

TABLE 4-continued

| asphere | CURV | E | F | G | H | J |
|---|---|---|---|---|---|---|
| A(1) | −0.00080028 | 0.000000 | −3.35378E − 09 | 5.36841E − 14 | −7.86902E − 19 | −5.07886E − 24 |
|  |  | 0.00000E + 00 | 0.00000E + 60 | 0.00000E + 00 | 0.00000E + 00 | 0.00000E + 00 |
| A(2) | 0.00040002 | 0.000000 | 1.68187E − 08 | 2.05570E − 12 | 2.42710E − 16 | 5.69764E − 20 |
|  |  | 0.00000E + 00 | 0.00000E + 00 | 0.00000E + 00 | 0.00000E + 00 | 0.00000E + 00 |
| A(3) | 0.00113964 | −2.760663 | 0.00000E + 00 | −3.55779E − 15 | 1.03888E − 19 | −3.64996E − 24 |
|  |  | 0.00000E + 00 | 0.00000E + 00 | 0.00000E + 00 | 0.00000E + 00 | 0.00000E + 00 |
| A(4) | 0.00128753 | 0.019273 | 0.00000E + 00 | 5.82746E − 18 | −1.77496E − 22 | 1.64954E − 27 |
|  |  | −6.20361E − 33 | 0.00000E + 00 | 0.00000E + 00 | 0.00000E + 00 | 0.00000E + 00 |
| A(5) | 0.00373007 | 11.6888968 | 0.00000E + 00 | −5.53902E − 12 | −4.32712E − 16 | −1.54425E − 19 |
|  |  | 0.00000E + 00 | 0.00000E + 00 | 0.00000E + 00 | 0.00000E + 00 | 0.00000E + 00 |
| A(6) | 0.00240387 | −0.002567 | 0.00000E + 00 | −6.78955E − 16 | −8.39621E − 21 | −2.95854E − 25 |
|  |  | 0.00000E + 00 | 0.00000E + 00 | 0.00000E + 00 | 0.00000E + 00 | 0.00000E + 00 |

Reference wavelength = 13 nm

FIG. 7 shows a similar, yet alternative, embodiment to that of FIG. 6 with a six-mirror objective with field mirror S1 as well as first and second subsystems as shown in FIG. 6. The embodiment shown in FIG. 7 comprises as the embodiment in FIG. 6 an intermediate image Z. Furthermore the aperture B is formed on the second mirror S2 similar and the numerical aperture on the image side is NA=0.30. The optical parameters of this alternative embodiment are shown in Table 5 in Code V(™) nomenclature.

TABLE 5

| element No. | radius | thickness | Diameter | type |
|---|---|---|---|---|
| object | INF | 103.2808 |  |  |
|  |  |  | 197.1874 |  |
|  |  | 219.3042 |  |  |
| S1 | A(1) | −39.2890 | 157.6222 | REFL |
|  |  |  | 142.1492 |  |
|  |  | −180.0152 |  |  |
|  |  | aperture | 67.2659 |  |
|  |  | 0.0000 |  |  |
| S2 | A(2) | 219.3042 | 67.4347 | REFL |
|  |  |  | 167.6895 |  |
|  |  | 131.2051 |  |  |
|  |  |  | 228.0182 |  |
|  |  | 0.0000 |  |  |
| S3 | A(3) | −131.2051 | 232.3162 | REFL |
|  |  |  | 401.4441 |  |
|  |  | −247.5850 |  |  |
| S4 | A(4) | 378.7901 | 613.5493 | REFL |
|  |  |  | 355.7774 |  |
|  |  | 134.4001 |  |  |
|  |  |  | 268.3735 |  |
|  |  | 348.5086 |  |  |
| S5 | A(5) | −348.5086 | 81.5255 | REFL |
| S6 | A(6) | 348.5086 | 269.2435 | REFL |
|  |  |  | 75.4983 |  |
| image | image width | 36.1195 |  |  |
|  |  |  | 53.9942 |  | aspherical constants:

$Z = (CURV) Y^2/[1 + (1 − (1 + K) (CURV)^2 Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$

| asphere | CURV | K<br>E | A<br>F | B<br>G | C<br>H | D<br>J |
|---|---|---|---|---|---|---|
| A(1) | −0.00061615 | 0.000000 |  | −5.19402E − 09 | 1.09614E − 13 | −3.44621E − 18 | 1.58573E − 22 |
|  |  | −7.07209E − 27 | 0.00000E + 00 | 0.00000E + 00 | 0.00000E + 00 | 0.00000E + 00 |
| A(2) | 0.00066911 | 0.000000 | 1.69112E − 08 | 2.39908E − 12 | 2.89763E − 16 | 1.00572E − 19 |
|  |  | 1.84514E − 29 | 0.00000E + 00 | 0.00000E + 00 | 0.00000E + 00 | 0.00000E + 00 |
| A(3) | 0.00140031 | 0.000000 | −8.71271E − 10 | −1.47622E − 15 | −3.40869E − 20 | 4.32196E − 24 |
|  |  | −2.23484E − 28 | 0.00000E + 00 | 0.00000E + 00 | 0.00000E + 00 | 0.00000E + 00 |
| A(4) | 0.00143731 | 0.000000 | 2.18165E + 12 | 2.65405E − 17 | −2.01757E − 22 | 1.14856E − 28 |
|  |  | 1.49857E − 32 | −8.61043E − 38 | 0.00000E + 00 | 0.00000E + 00 | 0.00000E + 00 |
| A(5) | 0.00378996 | 0.000000 | 8.54406E − 08 | 2.25929E − 12 | 3.36372E − 16 | 1.92565E − 20 |
|  |  | 5.75469E − 24 | 0.00000E + 00 | 0.00000E + 00 | 0.00000E + 00 | 0.00000E + 00 |
| A(6) | 0.00246680 | 0.000000 | −3.61754E − 12 | −8.29704E − 16 | −1.53440E − 20 | −2.24433E − 25 |
|  |  | 5.91279E − 30 | 0.00000E + 00 | 0.00000E + 00 | 0.00000E + 00 | 0.00000E + 00 |

Reference wavelength = 13 nm

Figure 8B:
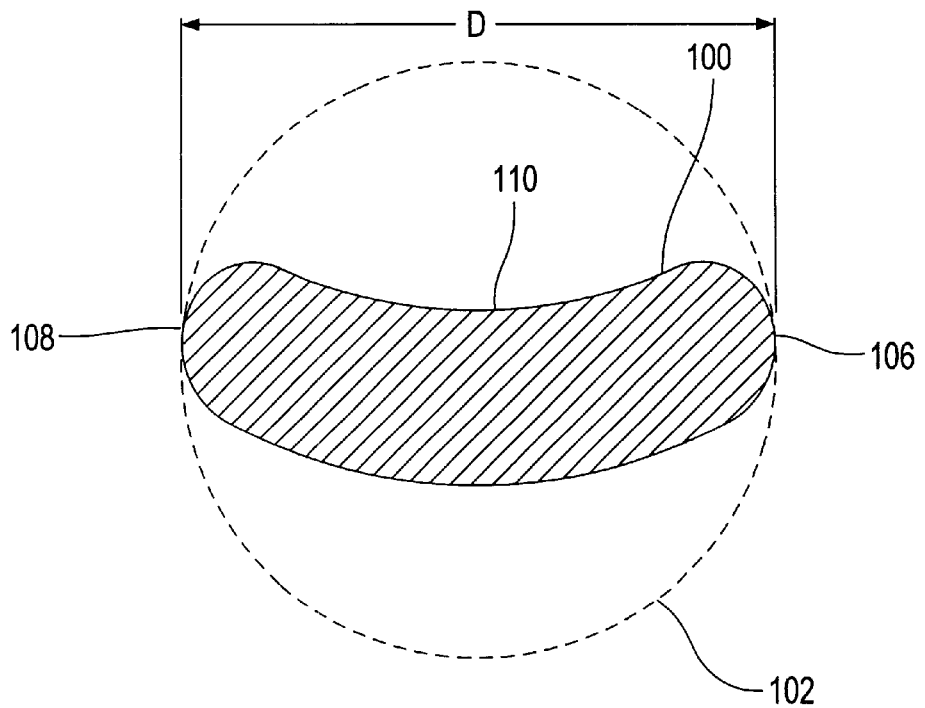

FIGS. 8A and 8B define the used diameter D as used in the description of the above embodiments. As a first example, the illuminated field 100 on a mirror in FIG. 8A is a rectangular field. The illuminated field corresponds to the area on a mirror onto which a bundle of light rays running through the objective from the object side to the image side impinge. The used diameter D according to FIG. 8A is then the diameter of the envelope circle 102, which encompasses the rectangle 100, where the corners 104 of the rectangle 100 lie on the envelope circle 102. A more realistic example is shown in FIG. 8B. The illuminated field 100 has a kidney shape, which is expected for the physical mirror surfaces of the mirrors S1–S6 or the so called used areas of the mirrors S1–S6, when the field in the image plane as well as the field in the object plane is an arc shaped field as depicted in FIG. 1. The envelope circle 102 encompasses the kidney shape fully and it coincides with the edge 110 of the kidney shape at two points, 106, 108. The used diameter D of the physical mirror surface or the used area of the mirrors S1–S6 is then given by the diameter of the envelope circle 102.

Thus, the invention provides a six-mirror projection objective with an imaging scale of preferably 4×, 5× or 6× for use in an EUV projection system. Other uses may be employed, however. The six-mirror projection objective has the resolution required for the image field, which is e.g. arc-shaped and has a advantageous structural design, since the aspheres of the mirror surfaces are relatively low, the angles of incidence of the rays of the bundle of light rays impinging the mirror surfaces are small, and there is enough room for mounting the mirrors.

I claim:

1. A projection objective with an object plane and an image plane and a light path for a bundle of light rays from the object plane to the image plane for use in short wavelength microlithography, comprising;

six mirrors (a first mirror (S1), a second mirror (S2), a third mirror (S3), a fourth mirror (S4), a fifth mirror (S5) disposed closest to the image plane and a sixth mirror (S6)) arranged in the light path such that an image-side numerical aperture (NA) is NA≧0.15, wherein each mirror has a physical mirror surface and wherein said fifth mirror is positioned in the light path such that at least one of the following conditions is satisfied:

an image-side optical free working distance is greater than or equal to a used diameter D of a physical mirror surface of the fifth mirror;

the image-side optical free working distance is greater than or equal to a sum of one-third of the used diameter of the physical mirror surface of the fifth mirror and a length between 20 mm and 30 mm; and the image-side optical free working distance is at least 50 mm;

wherein the image side free working distance is the physical distance between the vertex of the surface of the fifth mirror and the image plane and wherein the physical mirror surface of a mirror is the area of the surface of a mirror, where the rays of the bundle of light rays running from the object side to the image side impinge.

2. A projection objective with an object plane and an image plane and a light path for a bundle of light rays from the object plane to the image plane for use in short wavelength microlithography, comprising;

six mirrors (a first mirror (S1), a second mirror (S2), a third mirror (S3), a fourth mirror (S4), a fifth mirror (S5) disposed closest to the image plane, and a sixth mirror (S6)) arranged in the light path such that an image-side numerical aperture (NA) is NA≧0.15 and an image side arc-shaped field width (W) lies in the range of 1.0 mm≦W, and wherein each of said six mirrors has a physical mirror surface with a maximum aspherical peak-to-valley (PV) deviation (A) from a best-fitting sphere in the following range:

$A \leq 19\ \mu m - 102\ \mu m\ (0.25 - NA) - 0.7\ \mu m/mm\ (2\ mm - W)$ wherein the physical mirror surface of a mirror is the area of the surface of a mirror where the rays of the bundle of light rays running from the object side to the image side impinge.

3. A projection objective with an object plane and an image plane and a light path for a bundle of light rays from the object plane to the image plane for use in short wavelength microlithography, comprising;

six mirrors (a first mirror (S1), a second mirror (S2), a third mirror (S3), a fourth mirror (S4), a fifth mirror (S5) disposed closest to the image plane, and a sixth mirror (S6)) arranged such that an image-side numerical aperture (NA) is NA≧0.15 and an image-side arc-shaped field width (W) lies in the range of 1.0 mm≦W, and wherein the rays of a bundle of light rays incident on each physical mirror surface of the six mirrors have angles of incidence (AOI) relative to the surface normal of said physical mirror surface that are lying in the range:

$AOI \leq 23° - 35°(0.25 - NA) - 0.2°/mm(2\ mm - W)$ wherein the physical mirror surface of a mirror is the area of the surface of a mirror where the rays of the bundle of light rays running from the object side to the image side impinge.

4. A projection objective with an object plane and an image plane and a light path from the object plane to the image plane for use in short wavelength microlithography, comprising;

a field mirror (S1) with an imaging ratio $\beta_1 > 0$, wherein the field mirror produces a virtual image of an object in the object plane;

a first subsystem with a second mirror (S2), a third mirror (S3), and a fourth mirror (S4), wherein the first subsystem has an imaging ratio $\beta_2 < 0$, and wherein said first subsystem images the virtual image to a real intermediate image;

a second subsystem with a fifth mirror (S5) disposed closest to the image plane and a sixth mirror (S6), wherein the second subsystem images the intermediate image to a real image in the image plane; and wherein the objective has an image-side numerical aperture (NA) and an arc-shaped field width (W) in the image plane, where an object to be illuminated is situated, and wherein each mirror has a physical mirror surface that is the area of the surface of the mirror where the rays of the bundle of light rays running from the object side to the image side impinge.

5. A projection objective according to any one of claims 1 to 4, wherein the surface of the mirrors have a rotational symmetry with respect to a principal axis (PA).

6. A projection objective according to one of claims 1 to 4, further comprising an aperture stop (B) in the light path positioned between the second mirror (S2) and the third mirror (S3).

7. A projection objective according to claim 6, wherein a ratio of a physical distance between the vertex of the surface of the first mirror and the vertex of the surface of the third mirror (S1S3) to a physical distance between the vertex of the surface of the first mirror and the vertex of the surface of the second mirror (S1S2) is in the range of:

$$0.5 < S1S3/S1S2 < 2.$$

8. A projection objective according to claim 7, wherein a ratio of a physical distance between the vertex of the surface of the second mirror and the vertex of the surface of the third mirror (S2S3) to a physical distance between the vertex of the surface of the third mirror and the vertex of the surface of the fourth mirror (S3S4) lies in the range:

$$0.7 < S2S3/S3S4 < 1.4.$$

9. A projection objective according to any one of claims 1 to 4, wherein all physical mirror surfaces are aspherical.

10. A projection objective according to any one of claims 1 to 4, wherein at most five physical mirror surfaces are aspherical.

11. A projection objective according to any one of claims 1 to 4, wherein the second mirror, third mirror, fourth mirror, fifth mirror, and sixth mirror are in a concave-convex-concave-convex-concave sequence.

12. A projection objective according to any one of claims 1 to 4, wherein a physical distance between the vertex of the surface of the third mirror and the vertex of the surface of the sixth mirror (S3S6) satisfies the following relationship:

$$0.3 \text{ (used diameter of third mirror } S3 + \text{used diameter of sixth mirror } S6) < S3S6.$$

13. A microlithography projection exposure apparatus comprising:

a projection objective according to one of the claims 1 to 4; and an illumination system comprising a radiation source providing a bundle of light rays illuminating an arc-shaped field in the object plane of the projection objective, wherein the projection objective images a mask located in the object plane into the image plane of the projection objective, where a light sensitive objective is situated.

14. A method for producing a microelectronic device with a microlithography exposure apparatus according to claim 13 wherein a mask with a structure in the object plane is illuminated and said mask is imaged onto a light sensitive object situated in the image plane.

* * * * *